United States Patent
Rapoport

(10) Patent No.: US 8,604,794 B2
(45) Date of Patent: Dec. 10, 2013

(54) PERMANENT MAGNET ARRANGEMENT WITH SOLID FACING PLATE AND SCANNING MAGNET HEAD

(75) Inventor: Uri Rapoport, Moshav Ben Shemen (IL)

(73) Assignee: Aspect Imaging Ltd, Shoham (IL)

( * ) Notice: Subject to any disclaimer, the term of this patent is extended or adjusted under 35 U.S.C. 154(b) by 0 days.

(21) Appl. No.: 13/255,205

(22) PCT Filed: Apr. 21, 2010

(86) PCT No.: PCT/IL2010/000314
§ 371 (c)(1),
(2), (4) Date: Nov. 9, 2011

(87) PCT Pub. No.: WO2010/122551
PCT Pub. Date: Oct. 28, 2010

(65) Prior Publication Data
US 2012/0049848 A1    Mar. 1, 2012

Related U.S. Application Data

(60) Provisional application No. 61/171,084, filed on Apr. 21, 2009.

(51) Int. Cl.
*G01V 3/00* (2006.01)
(52) U.S. Cl.
USPC .......................................... 324/320; 324/319
(58) Field of Classification Search
USPC ......................................... 324/320, 319, 318
See application file for complete search history.

(56) References Cited

U.S. PATENT DOCUMENTS

| | | | |
|---|---|---|---|
| 4,672,346 A * | 6/1987 | Miyamoto et al. | 335/296 |
| 5,332,971 A | 7/1994 | Aubert | |
| 5,623,241 A | 4/1997 | Minkoff | |
| 6,281,775 B1 * | 8/2001 | Rapoport | 335/306 |
| 6,411,187 B1 | 6/2002 | Rotem et al. | |
| 6,670,877 B2 | 12/2003 | Rapoport | |
| 6,859,123 B2 * | 2/2005 | Zheng et al. | 335/296 |
| 7,023,309 B2 | 4/2006 | Laskaris et al. | |
| 7,053,743 B2 | 5/2006 | Laskaris et al. | |
| 7,148,689 B2 | 12/2006 | Huang et al. | |
| 7,323,875 B2 * | 1/2008 | Ni et al. | 324/320 |
| 2009/0085700 A1 | 4/2009 | Lian et al. | |

OTHER PUBLICATIONS

International Search Report and Written Opinion dated Aug. 25, 2010 in corresponding International Application No. PCT/IL2010/000314.

\* cited by examiner

*Primary Examiner* — Louis Arana
(74) *Attorney, Agent, or Firm* — The Law Office of Michael E. Kondoudis

(57) ABSTRACT

The present invention provides a permanent magnet arrangement, comprising: a. a mobile permanent magnet grouping; b. a facing plate constructed from ferromagnetic material; c. a an air gap defined by the spacing between said permanent magnet grouping and said facing plate; d. a yoke of predetermined shape formed from magnetically permeable material, said yoke holding said front surfaces of said magnets in a substantially parallel arrangement relative to said facing plate; e. means for individually moving said permanent magnets in said magnet grouping along an axis generally perpendicular to said facing plate; f. means for moving said permanent magnet grouping in a plane generally parallel to said facing plate; wherein a magnetic field within an active volume located in said air gap between said permanent magnet grouping and said facing plate is provided, said magnetic field sufficiently homogeneous for performance of MRI.

19 Claims, 2 Drawing Sheets

PERMANENT MAGNET ARRANGEMENT WITH SOLID FACING PLATE AND SCANNING MAGNET HEAD

FIELD OF THE INVENTION

The present invention relates generally to permanent magnet arrangements for equipment used to conduct magnetic resonance imaging (MRI) measurements. In particular, the invention relates to a magnet arrangement in which a permanent magnet assembly opposes a solid facing plate and in which the permanent magnet assembly can be moved to enable measurement of an object lying in a specific area of the facing plate.

BACKGROUND OF THE INVENTION

MRI has developed into one of the most versatile and useful tools available in medicine and biology. Despite its wide use as a diagnostic and experimental method, several practical difficulties remain in its implementation. Among these are the high maintenance costs for a typical MRI system. For example, a cryogenic magnet system requires frequent replacement of liquid helium and liquid nitrogen. In addition, in a typical MRI apparatus, the patient is introduced into a cramped cylindrical chamber, leading to anxiety and claustrophobia.

One approach that has been taken to address some of these problems has been the use of permanent magnets as the source of the magnetic field, and many examples of designs of permanent magnet systems adapted for MRI are known in the prior art.

For example, U.S. Pat. No. 5,332,971 teaches and describes a permanent magnet for MRI that utilizes a number of magnetic blocks arranged into concentric rings to produce a homogeneous magnetic field. U.S. Pat. No. 5,623,241 teaches and describes a permanent magnet structure comprising a C-shaped yoke that supports two opposed magnet groupings at the open end of the frame legs. The magnet groupings are single-piece permanent magnets arranged in a parallel, face-to-face relationship, with each magnet having a pole piece positioned on its outer face. U.S. Pat. No. 6,670,877 teaches and describes an improved permanent magnet arrangement for MRI in which opposing magnet groupings face each other across an air gap and which further improves the magnetic field strength and homogeneity by attaching the magnet groupings to backing plates. U.S. Pat. Nos. 7,023,309 and 7,053,743 teach and describe additional refinements of permanent magnet assemblies for MRI in which the presence of soft magnetic material between the yoke and the magnet groupings obviates the need for additional pole pieces.

These designs all suffer from several problems. In all cases, the magnets are permanently positioned, so the active volume is fixed in space, and the body part of interest must be inserted into the active volume. In addition, the arrangements taught in the prior art tend to be large and unwieldy. Thus, there remains a long-felt need for a permanent magnet arrangement suitable for use in an MRI system that is relatively lightweight, open to the air, and in which the active volume can be defined by the user. The present invention, which comprises a mobile permanent magnet above a ferromagnetic facing plate, is designed to answer this long-felt need.

BRIEF DESCRIPTION OF THE INVENTION

It is thus an object of the present invention to provide a permanent magnet arrangement in which a mobile permanent magnet arrangement is able to provide an active volume wherever the user desires, comprising (a) a mobile permanent magnet grouping; (b) a facing plate constructed from ferromagnetic material; (c) an air gap defined by the spacing between said permanent magnet grouping and said facing plate; (d) said permanent magnet grouping comprising: (i) a central permanent magnet of substantially circular cross-section, (ii) at least one permanent magnet of substantially annular cross-section arranged substantially concentrically with respect to said central permanent magnet, and (iii) each of said permanent magnets having a front surface and a rear surface, each said front surface facing said air gap; (d) a yoke of shape chosen from (i) generally C-shaped and (ii) generally H-shaped, formed from magnetically permeable material, said yoke holding said front surfaces of said magnets in a substantially parallel arrangement relative to said facing plate; (e) means for individually moving said permanent magnets in said magnet grouping along an axis generally perpendicular to said facing plate; and (f) means for moving said permanent magnet grouping in a plane generally parallel to said facing plate. It is within the essence wherein said permanent magnet structure provides a magnetic field between said permanent magnet grouping and said facing plate that is sufficiently homogeneous for performance of Magnetic Resonance Imaging (MRI) and further wherein said permanent magnet structure enables performance of MRI on a patient in a non-enclosed structure.

It is a further object of this invention to provide such a permanent magnet arrangement, in which positioning of said mobile permanent magnet grouping is remotely controlled by a mechanical device operating according to a predetermined algorithm.

It is a further object of this invention to provide such a permanent magnet arrangement, additionally comprising at least one shim assembly, each of said at least one shim assemblies arranged about said permanent magnet grouping, wherein said at least one shim assembly is adapted to provide additional homogeneity to the magnetic field within the active volume.

It is a further object of this invention to provide such a permanent magnet arrangement, additionally comprising at least one gradient coil, each of said at least one gradient coils arranged about of one of said permanent magnet grouping, wherein said gradient coils provide fine adjustment of said magnetic field.

It is a further object of this invention to provide such a permanent magnet arrangement, in which said at one gradient coil is adapted for providing a magnetic field gradient in said active volume, said magnetic field gradient being adapted for use in MRI of a body or part thereof located within said active volume.

It is a further object of this invention to provide method of providing a homogeneous magnetic field within an active volume within a permanent magnet structure of non-enclosed structure of Magnetic Resonance Imaging (MRI), namely an active volume located in an air gap between a permanent magnet grouping and a facing plate. The method comprises steps of (a) providing a permanent magnet arrangement, comprising: a mobile permanent magnet grouping; a facing plate constructed from ferromagnetic material; and an air gap defined by the spacing between said permanent magnet grouping and said facing plate; (b) grouping said permanent magnet to provide a central permanent magnet of substantially circular cross-section; at least one permanent magnet of substantially annular cross-section arranged substantially concentrically with respect to said central permanent magnet; each of said permanent magnets having a front surface and a rear surface, each said front surface facing said air gap; (c) selecting a yoke of shape chosen from a group consisting of (i) generally C-shaped and (ii) generally U-shaped, formed from magnetically permeable material, holding said front surfaces of said magnets by said yoke in a substantially parallel arrangement relative to said facing plate; (d) providing means for individually moving said permanent magnets in said magnet grouping along an axis generally perpendicular to said facing plate; and, (e) providing means for moving said permanent magnet grouping in a plane generally parallel to said facing plate.

DETAILED DESCRIPTION OF THE INVENTION

It will be apparent to one skilled in the art that there are several embodiments of the invention that differ in details of construction, without affecting the essential nature thereof, and therefore the invention is not limited by that which is illustrated in the figures and described in the specification, but only as indicated in the accompanying claims, with the proper scope determined only by the broadest interpretation of said claims.

As used herein, the term "active volume" describes a volume in space into which an object (e.g. part of the body of an experimental subject) for MRI analysis can be inserted, and in which the permanent magnet assembly disclosed herein provides a magnetic field sufficiently homogeneous for MRI analysis.

Figure 1:
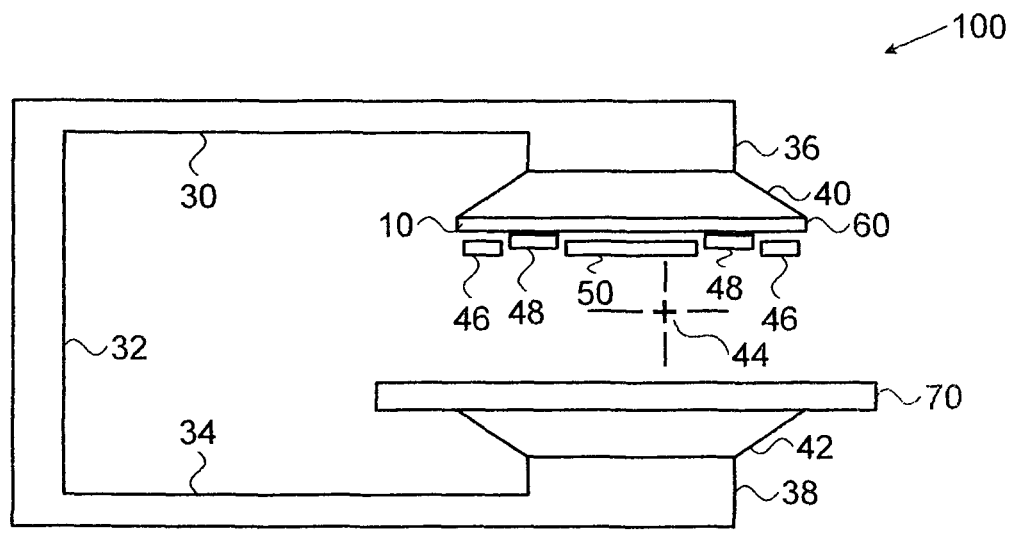
FIG. 1 is a schematic cross-sectional view of one embodiment of the invention.

Reference is now made to FIG. 1, in which a schematic cross section of an embodiment 100 of the magnet arrangement disclosed in the invention is shown. The magnet arrangement is supported by a generally C-shaped yoke. The yoke comprises a support arm 32, a upper cross-piece 30, a lower cross-piece 34, an upper support arm 36, and a lower support arm 38. The yoke is preferably constructed of a ferromagnetic material, for example soft steel. The lower cross-piece supports a facing plate 70, similarly constructed from a ferromagnetic material such as (but not limited to) soft steel or iron, which in this embodiment rests on a support piece 42, likewise constructed of ferromagnetic material.

The upper cross-piece is designed to hold a permanent magnet grouping assembly 10. The permanent magnet grouping assembly comprises a series of permanent magnets, including a central magnet 50 of generally circular cross-section and a plurality of magnets of generally annular cross-section aligned generally concentrically with it; in the specific embodiment shown, there are two such annular magnets, 46 and 48; other embodiments may include more or fewer depending on the specific needs of the user. The magnets that compose the permanent magnet grouping assembly may each be a single piece (that is, central magnet 50 is a one-piece disk while outer magnets 46 and 48 are single-piece toroidal rings), it is acknowledged and emphasized that the magnets may be constructed of a plurality of individual segments. The distance between the magnet grouping and the facing plate defines an air gap 44. The magnets are shown schematically in FIG. 1 to demonstrate that each magnetic ring or element is separately adjustable throughout a vertical length of travel toward or away from the air gap. Each such element is also adjustable in a horizontal plane to "tilt" each individual element in order to establish a parallel relationship with the upper surface of facing plate 70.

Magnet grouping assembly 10 is attached to upper support arm 36 of the yoke via a backing plate 60 and a support block 40. It has been found that such a backing plate increases the strength and the uniformity of the magnetic field across air gap 44 without requiring auxiliary magnets or shim coils.

In a preferred embodiment of the invention, it also includes means for moving and positioning the magnet grouping assembly in the plane generally parallel to the upper surface of facing plate 70. Said moving and positioning means can be of any type well known in the prior art for moving and fine positioning of mechanical equipment, e.g. a remote-control device or a robot. Such devices are capable of fixing the position of the equipment to be moved to within 0.1 mm or less, i.e., with much greater precision than the resolution of MRI itself (which is generally of order of magnitude ~1 mm). The machinery of the moving and position means can be located within the upper support arm 36 or can be external to the yoke.

Figure 2:
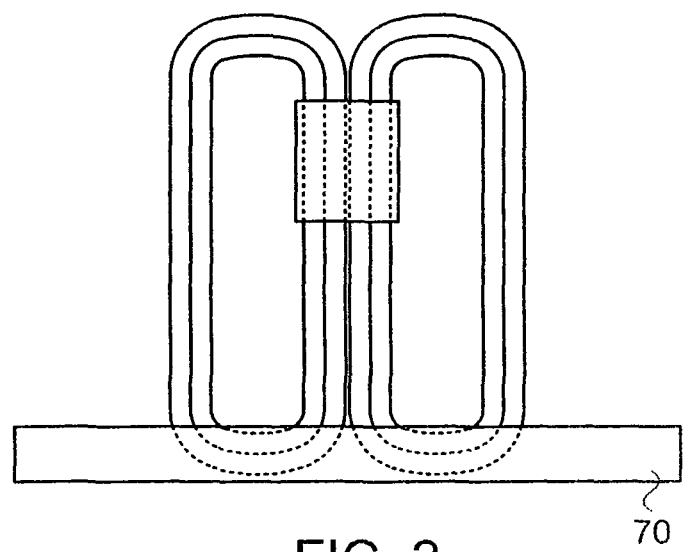
FIG. 2 is a schematic representation of lines of magnetic flux in the active volume of the embodiment shown in FIG. 1.

Reference is now made to FIG. 2, which schematically shows the magnetic lines of flux in the active volume (which is that portion of air gap 44 in which the magnetic field is essentially homogeneous). The lines of flux are compressed within the ferromagnetic facing plate. More significantly, because of the design of the magnet grouping assembly, the homogeneity of the field within the active volume is sufficient to allow the use of the device as a source of the magnetic field required for MRI.

Figure 3:
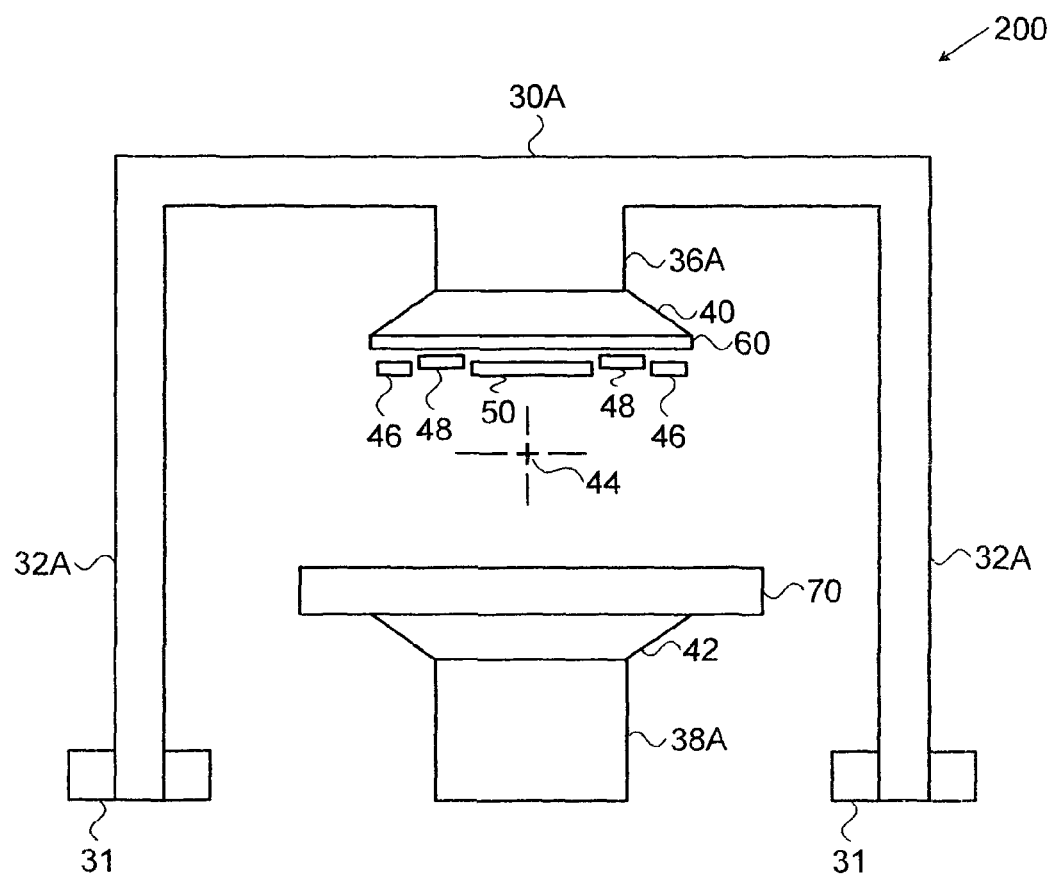
FIG. 3 shows a schematic cross-sectional view of a second embodiment of the invention.

Reference is now made to FIG. 3, which shows a schematic cross-section of a second embodiment 200 of the invention herein disclosed. In this embodiment, the yoke is generally U-shaped rather than C-shaped, with two vertical supports 32A, a horizontal cross-piece 30A, and vertical support bases 31 to fix the position of the yoke. In this embodiment, the facing plate sits on pedestal 38A, which can be independent of the yoke (as shown in FIG. 3) or attached to it. As in the previous embodiment, the yoke and pedestal are preferably made of ferromagnetic material. This arrangement is particularly adapted for stabilizing the mobile magnet grouping assembly and for ease of attachment of the moving and positioning means. In a third embodiment (not shown), the yoke comprises a rectangular ceiling to which the magnet grouping assembly and its supports are attached. The rectangular ceiling is held in place by at least four legs (one supporting each corner; additional legs may be placed at the sides).

Several additional embodiments of the invention (each of which is applicable to any of the yoke and moving/positioning means described above) include modifications to the permanent magnet assembly grouping. These modifications are particularly aimed at increasing the practicality of the invention as a magnet assembly for use in MRI studies of a body or a part thereof. In particular, in one additional embodiment, the magnet grouping further comprises at least one shim assembly. Such a shim assembly, arranged about the permanent magnet grouping and constructed according to principles well-known to those skilled in the art, provides additional homogeneity to the magnetic field within the active volume, and compensates for effects such as (but not limited to) edge effects or slight imperfections in the construction or materials of the magnets within the permanent magnet grouping.

Other embodiments include, in addition to or instead of the shim assembly, gradient coils. MRI is generally practiced using a magnetic field with a known gradient so that an image may be constructed. Since the resonance frequency of a particular NMR transition depends on the magnetic field strength, gradients are used so that the origin of a particular NMR signal can be located in space. As described above, the basic embodiment of the invention disclosed herein provides a highly homogeneous magnetic field; in order that the invention will be appropriate for use specifically in imaging of a multi-dimensional sample (e.g. a body or a part thereof), it will be necessary to provide means for obtaining magnetic field gradients. Thus, additional embodiments of the invention will include at least one gradient coil assembly. This gradient coil assembly, arranged about the permanent magnet grouping and constructed according to principles well-known to those skilled in the art, is particularly adapted for providing a magnetic field gradient within the active volume. The specific gradient necessary will depend on the particular needs of the individual user, and thus the details of the gradient coil assembly will necessarily depend on the particular needs of the specific user as well.

The various embodiments disclosed above are provided useful to disclose a method of providing a homogeneous magnetic field within an active volume within a permanent magnet structure of non-enclosed structure of Magnetic Resonance Imaging (MRI), namely an active volume located in an air gap between a permanent magnet grouping and a facing plate. This new method comprises, inter alia, steps of (a) providing a permanent magnet arrangement, comprising: a mobile permanent magnet grouping; a facing plate constructed from ferromagnetic material; and an air gap defined by the spacing between said permanent magnet grouping and said facing plate; (b) grouping said permanent magnet to provide a central permanent magnet of substantially circular cross-section; at least one permanent magnet of substantially annular cross-section arranged substantially concentrically with respect to said central permanent magnet; each of said permanent magnets having a front surface and a rear surface, each said front surface facing said air gap; (c) selecting a yoke of shape chosen from a group consisting of (i) generally C-shaped and (ii) generally U-shaped, formed from magnetically permeable material, holding said front surfaces of said magnets by said yoke in a substantially parallel arrangement relative to said facing plate; (d) providing means for individually moving said permanent magnets in said magnet grouping along an axis generally perpendicular to said facing plate; and, (e) providing means for moving said permanent magnet grouping in a plane generally parallel to said facing plate

What is claimd is:

1. A method of providing a homogeneous magnetic field within an active volume located in an air gap between a permanent magnet grouping and a facing plate within a permanent magnet structure of non-enclosed structure of Magnetic Resonance Imaging (MRI), said method comprising:
providing a permanent magnet arrangement comprising:
a yoke of shape selected from (i) generally C-shaped and (ii) generally U-shaped, formed from magnetically permeable material, said yoke having two ends defining an air gap therebetween;
a single mobile permanent magnet grouping secured to a back plate mechanically connected to one end of said yoke; said mobile permanent magnet grouping comprising:
a one-piece, disk-shaped central permanent magnet;
at least one permanent magnet of substantially annular cross-section arranged substantially concentrically with respect to said central permanent magnet;
each of said permanent magnets having a front surface and a rear surface, each said front surface facing said air gap;
moving means for individually laterally and longitudinally moving said permanent magnets in said magnet grouping along an axis within said air gap; and,
a facing plate constructed from ferromagnetic material mounted to the second end of said yoke, said facing plate disposed opposite to said mobile permanent magnet grouping and parallel to said back plate;
thereby providing a magnetic field within an active volume located in said air gap between said mobile permanent magnet grouping and said facing plate, wherein said magnetic field is sufficiently homogeneous for performance of Magnetic Resonance Imaging (MRI) and further wherein said permanent magnet structure enables performance of MRI on a patient in a non-enclosed structure.

2. A permanent magnet arrangement, comprising:
a yoke of shape selected from (i) generally C-shaped and (ii) generally U-shaped, formed from magnetically permeable material, said yoke having two ends defining an air gap therebetween;
a single mobile permanent magnet grouping secured to a back plate mechanically connected to one end of said yoke; said single mobile permanent magnet grouping comprising:
a one-piece, disk-shaped central permanent magnet;
at least one permanent magnet of substantially annular cross-section arranged substantially concentrically with respect to said central permanent magnet;
each of said permanent magnets having a front surface and a rear surface, each said front surface facing said air gap; and,
lateral and longitudinal moving means for individually laterally and longitudinally moving said permanent magnets in said magnet grouping along an axis within said air gap,
wherein said permanent magnet arrangement comprises a facing plate constructed from ferromagnetic material mounted to the second end of said yoke, opposite to said mobile permanent magnet grouping and parallel to said back plate, thereby providing a magnetic field within an active volume located in said air gap between said mobile permanent magnet grouping and said facing plate, and
wherein said magnetic field sufficiently homogeneous for performance of Magnetic Resonance Imaging (MRI) and further wherein said permanent magnet structure enables performance of MRI on a patient in a non-enclosed structure.

3. The permanent magnet arrangement of claim 2, wherein positioning of said mobile permanent magnet grouping is remotely controlled by a mechanical device operating according to a predetermined algorithm.

4. The permanent magnet arrangement of claim 3, additionally comprising at least one gradient coil, each of said at least one gradient coils arranged about of one of said permanent magnet grouping, wherein said gradient coils provide fine adjustment of said magnetic field.

5. The permanent magnet arrangement of claim 3, additionally comprising at least one shim assembly, each of said at least one shim assemblies arranged about said permanent magnet grouping, wherein said at least one shim assembly is adapted to provide additional homogeneity to the magnetic field within the active volume.

6. The permanent magnet arrangement of claim 5, additionally comprising at least one gradient coil, each of said at least one gradient coils arranged about of one of said permanent magnet grouping, wherein said gradient coils provide fine adjustment of said magnetic field.

7. The permanent magnet arrangement of claim 5, wherein said at least one gradient coil is adapted for providing a magnetic field gradient in said active volume, said magnetic field gradient being adapted for use in MRI of a body or part thereof located within said active volume.

8. The permanent magnet arrangement of claim 2, additionally comprising at least one shim assembly, each of said at least one shim assemblies arranged about said permanent magnet grouping, wherein said at least one shim assembly is adapted to provide additional homogeneity to the magnetic field within the active volume.

9. The permanent magnet arrangement of claim 8, additionally comprising at least one gradient coil, each of said at least one gradient coils arranged about of one of said permanent magnet grouping, wherein said gradient coils provide fine adjustment of said magnetic field.

10. The permanent magnet arrangement of claim 2, additionally comprising at least one gradient coil, each of said at least one gradient coils arranged about of one of said permanent magnet grouping, wherein said gradient coils provide fine adjustment of said magnetic field.

11. A permanent magnet arrangement having at least one first end and at least one second end, said first end and said second end positioned opposite to each other and defining an air gap therebetween, said magnet arrangement comprising:
   a single mobile permanent magnet grouping secured to said first end of said arrangement, comprising:
   a one-piece, disk-shaped central permanent magnet;
   at least one permanent magnet arranged substantially concentrically with respect to said central permanent magnet;
   each of said permanent magnets facing said air gap; and,
   lateral and longitudinal moving means for individually laterally and longitudinally moving said permanent magnets in said magnet grouping along an axis within said air gap,
   wherein said permanent magnet arrangement comprises a facing plate constructed from ferromagnetic material mounted to said second end of said magnet arrangement, adapted to provide a magnetic field within an active volume located in said air gap between said mobile permanent magnet grouping and said facing plate; further wherein said magnetic field sufficiently homogeneous for performance of Magnetic Resonance Imaging (MRI) in a non-enclosed structure.

12. The permanent magnet arrangement of claim 11, wherein positioning of said mobile permanent magnet grouping is remotely controlled by a mechanical device operating according to a predetermined algorithm.

13. The permanent magnet arrangement of claim 12, additionally comprising at least one gradient coil, each of said at least one gradient coils arranged about of one of said permanent magnet grouping, wherein said gradient coils provide fine adjustment of said magnetic field.

14. The permanent magnet arrangement of claim 12, additionally comprising at least one shim assembly, each of said at least one shim assemblies arranged about said permanent magnet grouping, wherein said at least one shim assembly is adapted to provide additional homogeneity to the magnetic field within the active volume.

15. The permanent magnet arrangement of claim 14, additionally comprising at least one gradient coil, each of said at least one gradient coils arranged about of one of said permanent magnet grouping, wherein said gradient coils provide fine adjustment of said magnetic field.

16. The permanent magnet arrangement of claim 14, wherein said at least one gradient coil is adapted for providing a magnetic field gradient in said active volume, said magnetic field gradient being adapted for use in MRI of a body or part thereof located within said active volume.

17. The permanent magnet arrangement of claim 11, additionally comprising at least one shim assembly, each of said at least one shim assemblies arranged about said permanent magnet grouping, wherein said at least one shim assembly is adapted to provide additional homogeneity to the magnetic field within the active volume.

18. The permanent magnet arrangement of claim 17, additionally comprising at least one gradient coil, each of said at least one gradient coils arranged about of one of said permanent magnet grouping, wherein said gradient coils provide fine adjustment of said magnetic field.

19. The permanent magnet arrangement of claim 11, additionally comprising at least one gradient coil, each of said at least one gradient coils arranged about of one of said permanent magnet grouping, wherein said gradient coils provide fine adjustment of said magnetic field.

* * * * *